(12) United States Patent
Li et al.

(10) Patent No.: US 9,881,985 B2
(45) Date of Patent: Jan. 30, 2018

(54) OLED DEVICE, AMOLED DISPLAY DEVICE AND METHOD FOR MANUFACTURING SAME

(71) Applicant: BOE TECHNOLOGY GROUP CO., LTD., Beijing (CN)

(72) Inventors: Yanzhao Li, Beijing (CN); Gang Wang, Beijing (CN); Woobong Lee, Beijing (CN); Li Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 13/878,905

(22) PCT Filed: Oct. 10, 2012

(86) PCT No.: PCT/CN2012/082716
§ 371 (c)(1),
(2) Date: Apr. 11, 2013

(87) PCT Pub. No.: WO2013/127180
PCT Pub. Date: Sep. 6, 2013

(65) Prior Publication Data
US 2014/0175385 A1    Jun. 26, 2014

(30) Foreign Application Priority Data
Feb. 28, 2012   (CN) .......................... 2012 1 0048814

(51) Int. Cl.
*H01L 27/32*    (2006.01)
*H01L 51/52*    (2006.01)
(Continued)

(52) U.S. Cl.
CPC ...... *H01L 27/3276* (2013.01); *H01L 27/1225* (2013.01); *H01L 27/3248* (2013.01);
(Continued)

(58) Field of Classification Search
USPC .......................................................... 257/40
See application file for complete search history.

(56) References Cited

U.S. PATENT DOCUMENTS 5,614,728 A * 3/1997 Akiyama ............... H01L 27/12
257/347
2005/0242714 A1* 11/2005 Chung ............... H01L 27/3283
313/504
(Continued)

FOREIGN PATENT DOCUMENTS

CN    101615613 A    12/2009
CN    102222772 A    10/2011
(Continued)

OTHER PUBLICATIONS

Third Chinese Office Action Appln. No. 201210048814.3; dated Mar. 24, 2015.
(Continued)

*Primary Examiner* — Cuong Q Nguyen
*Assistant Examiner* — Nishath Yasmeen
(74) *Attorney, Agent, or Firm* — Ladas & Parry LLP

(57) ABSTRACT

Embodiments of the invention disclose an OLED device, an AMOLED display device and a method for manufacturing the AMOLED display device. the AMOLED display device comprises a TFT active layer, a pixel electrode layer and an OLED device; the OLED device comprises a cathode layer and a functional layer, and the pixel electrode layer serves as the anode layer of the OLED device; alternatively, the OLED device comprises an anode layer and a functional layer, and the pixel electrode layer serves as the cathode layer of the OLED device. Moreover, the TFT active layer and the pixel electrode layer are formed from a same IGZO film by a patterning process.

5 Claims, 3 Drawing Sheets

(51) Int. Cl.
*H01L 51/56* (2006.01)
*H01L 27/12* (2006.01)

(52) U.S. Cl.
CPC ...... *H01L 51/5206* (2013.01); *H01L 51/5221* (2013.01); *H01L 51/5234* (2013.01); *H01L 51/56* (2013.01); *H01L 51/5271* (2013.01); *H01L 2227/323* (2013.01); *H01L 2251/305* (2013.01); *H01L 2251/5323* (2013.01); *H01L 2251/5353* (2013.01)

(56) References Cited

U.S. PATENT DOCUMENTS

| | | | |
|---|---|---|---|
| 2006/0038484 A1* | 2/2006 | Noh | C07D 487/16 313/499 |
| 2006/0043377 A1* | 3/2006 | Hoffman | H01L 29/7869 257/72 |
| 2007/0111369 A1* | 5/2007 | Chun | H01L 27/3246 438/99 |
| 2007/0120475 A1* | 5/2007 | Ishitani | H01L 51/5281 313/506 |
| 2008/0203394 A1* | 8/2008 | Kwok et al. | 257/66 |
| 2009/0072233 A1* | 3/2009 | Hayashi et al. | 257/43 |
| 2009/0146930 A1* | 6/2009 | Nishimura | H01L 27/3262 345/80 |
| 2010/0133991 A1* | 6/2010 | Kim | H01L 27/3262 313/504 |
| 2010/0289023 A1* | 11/2010 | Choi et al. | 257/59 |
| 2011/0127520 A1* | 6/2011 | You | H01L 29/7869 257/43 |
| 2011/0195196 A1* | 8/2011 | Kim | 427/453 |
| 2011/0204370 A1* | 8/2011 | Yoon | H01L 27/1214 257/59 |
| 2011/0248258 A1 | 10/2011 | Kim et al. | |
| 2011/0290310 A1 | 12/2011 | Kuramachi et al. | |
| 2012/0038601 A1 | 2/2012 | Huang et al. | |

FOREIGN PATENT DOCUMENTS

| | | |
|---|---|---|
| JP | 06-097061 A | 4/1994 |
| JP | 07-008704 A | 1/1995 |
| JP | 09-320949 A | 12/1997 |
| JP | 10-002665 A | 1/1998 |
| JP | 2000-111252 A | 4/2000 |
| JP | 2000-187111 A | 7/2000 |
| JP | 2009-053371 A | 3/2009 |
| JP | 2009-237132 A | 10/2009 |
| JP | 2010-085685 A | 4/2010 |
| JP | 2010-102226 A | 5/2010 |
| JP | 2010-244006 A | 10/2010 |
| WO | 2010/038669 A1 | 4/2010 |

OTHER PUBLICATIONS

International Search Report dated Nov. 29, 2011; PCT/JP2011/074558.
First Chinese Office Action dated Apr. 3, 2014; Appln. No. 201210048814.3.
International Preliminary Report on Patentability dated Sep. 2, 2014; PCT/CN2012/082716.
Second Chinese Office Action Appln. No. 20121004.8814,3, dated Nov. 3, 2014.

* cited by examiner

OLED DEVICE, AMOLED DISPLAY DEVICE AND METHOD FOR MANUFACTURING SAME

TECHNICAL FIELD

Embodiments of the invention relate to an OLED device, an AMOLED display device and a method for manufacturing the AMOLED device.

BACKGROUND

The basic structure of an organic light emitting diode (OLED) includes an anode layer, functional layers and a cathode layer. The functional layers include a hole transport layer, a light emitting layer and an electron transport layer. When a proper voltage is provided across the cathode and the anode, electrons and holes are injected from the cathode and the anode into the electron layer and the hole transport layer, and further migrate to the light emitting layer via the electron layer and the hole transport layer, respectively. The holes and electrons combine within the light emitting layer to generate light, thereby achieving the property of light emitting of the OLED device by itself.

In order to increase the light emitting efficiency, the anode material for the OLED device must have a high work function and light transmittance, while the cathode material generally requires a low work function. Therefore, indium tin oxide (ITO) transparent conductive film, which has a work function of 4.5 eV~5.3 eV and a stable property and allows light to transmit, is widely used as the anode material for an OLED. A metal having a low work function, such as Al, Ca, Li, Mg, etc., or a composite metal with a low work function is generally used as the cathode material. However, the work function of an ITO film or various metals itself is constant, and increasing the work function of the ITO film or decreasing the work functions of metals is primarily achieved by conducting a surface treatment on them. Therefore, there is a limited range within which the work function of electrodes of the prior art OLED devices can be adjusted, which limits the increase of the display efficiency of an OLED device.

Moreover, active matrix organic light emitting diode (AMOLED) display device essentially consists of thin film transistors (TFTs) and OLEDs. A TFT comprises structures such as a gate electrode, a gate insulation layer, a source layer, drain and source electrodes, etc. An OLED comprises structures such as an anode layer, a hole transport layer, a light emitting layer, an electron transport layer, a cathode layer, etc. The anode or cathode of the OLED is connected to the TFT. This complicated structure causes an issue that an AMOLED has to be prepared in a complicated manufacture process and high production costs.

SUMMARY

Embodiments of the invention provide an OLED device, an AMOLED display device and a method for manufacturing the AMOLED display for expanding the range within which the work function of electrodes of the OLED device can be adjusted, and meanwhile increasing the light emitting efficiency of the OLED device, simplifying the manufacture process of the AMOLED display device and reducing production costs.

According to one aspect of the invention, there is provided an OLED device comprising an anode layer, a functional layer and a cathode layer, wherein at least one of the cathode layer and the anode layer is made of an oxide semiconductor material indium gallium zinc oxide (IGZO).

According to another aspect of the invention, there is provided an AMOLED display device comprising a TFT active layer, a pixel electrode layer and an OLED device. The OLED device comprises an anode layer and a functional layer, the pixel electrode layer serving as the cathode layer of the OLED device; alternatively, the OLED device comprises an anode layer and a functional layer, the pixel electrode layer serving as the cathode layer of the OLED device; and the TFT active layer and the pixel electrode layer are formed from a same IGZO film by a patterning process.

According to yet another aspect of the invention, there is provided a method for manufacturing an AMOLED display device comprising forming in sequence a gate electrode and a gate insulation layer on a substrate; depositing an IGZO film layer and patterning the IGZO film layer to obtain a TFT active layer and a pixel electrode layer; forming in sequence a source electrode, a drain electrode, and a pixel defining layer, the pixel defining layer having an opening that exposes the pixel electrode layer; and forming an OLED device, wherein the pixel electrode layer serves as an anode or a cathode of the OLED device.

In the OLED device provided in an embodiment of the invention, an IGZO film is used for the cathode layer and/or the anode layer, and compared with the prior art, the work function of the electrode of the OLED device has a wider range within which it can be adjusted, and meanwhile the light emitting efficiency of the OLED device is improved.

Embodiments of the invention provide an AMOLED display device and a method for manufacturing the AMOLED display device, the TFT active layer and the pixel electrode layer are formed from the same IGZO film by a same deposition, photolithography and etching process. This pixel electrode layer serves as the cathode layer or the anode layer of the OLED device. Compared with the prior art, the process for preparing the pixel electrode layer during manufacturing the AMOLED display device is omitted, thereby reducing the production costs of the AMOLED display device, and shortening the production duration.

BRIEF DESCRIPTION OF THE DRAWINGS

In order to more clearly illustrate the technical solutions of the embodiments of the present invention, figures of the embodiments will be briefly introduced below. Apparently, the figures in the following description merely relate to some embodiments of the present invention and are not limiting the present invention.

DETAILED DESCRIPTION

In order to make the object, technical solutions and advantages of the embodiments of the invention more clear, the technical solutions of the embodiments of the present invention are clearly and completely described below in relation to the figures of the embodiments of the present invention. Apparently, the embodiments described are merely some, rather than all embodiments of the present invention. Based on the embodiments of the invention described, any other embodiments obtained by a person of ordinary skill in the art without resorting to creative labor are within the scope of the present invention.

Figure 1:
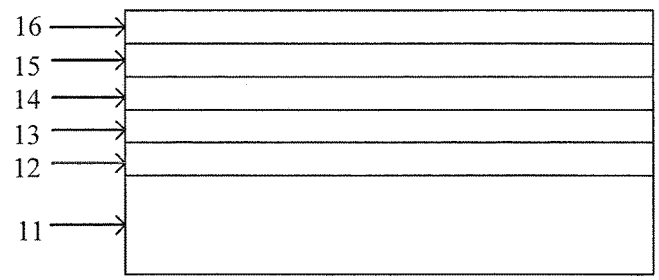
FIG. 1 is a structure diagram of an OLED device provided in an embodiment of the invention.

An OLED device provided in an embodiment of the invention, as shown in FIG. 1, comprises a substrate 11, an anode layer 12, a hole transport layer 13, a light emitting layer 14, an electron transport layer 15 and a cathode layer 16. The hole transport layer 13, the light emitting 14, and the electron transport layer 15 are functional layers. Either or both of the anode layer 12 and the cathode layer 16 are formed with an oxide semiconductor indium gallium zinc oxide ($InGaZnO_4$, IGZO). Furthermore, the IGZO film may be further subject to a surface treatment process.

As an example, the substrate 11 of the OLED device is made of transparent glass; the anode layer 12 consists of an Au metal layer with a thickness of 5-10 nm and an Al metal layer with a thickness of 100-300 nm; the hole transport layer 13 is NPB (N,N'-diphenyl-N,N'-bis(1-naphthyl)-1,1'-diphenyl-4,4'-diamine); the electron transport layer 15 and the light emitting layer 14 are combined into one layer, which is made of 8-hydroxyquinoline aluminum (ALQ) with a thickness of 30-70 nm; the cathode layer 16 is an IGZO film with a thickness of 100 nm. Preferably, the IGZO cathode layer 16 is subject to a surface treatment process with $H_2$ plasma for a time period of, e.g., 1 minute. In another Example, the electron transport layer 15 and the light emitting layer 14 can be in separate layers and formed individually.

An IGZO film is used for the cathode layer of the OLED device; compared with the OLED device in prior art that employs a metal material for the cathode layer, the work function of the IGZO film can be adjusted by adjusting the element contents of indium, gallium, zinc and oxide within the IGZO film, expanding the range within which the work function of the cathode of the OLED device can be adjusted. After the surface treatment on the IGZO cathode layer, the work function of the cathode layer can be further decreased, thereby the light emitting efficiency of the OLED device can be improved.

As an example, the substrate 11 of the OLED device is made of quartz; the anode layer 12 is an IGZO film with a thickness of 50 nm; the hole transport layer 13 is NPB with a thickness of 50 nm; and the light emitting layer 14 is made by evaporation deposition process with sub-pixel region masks (for example, masks for the red, green and blue sub-pixel region, respectively). The green, blue and red sub-pixel regions are made of a primary materials doped with a phosphorescent material in a thickness of 25 nm: CBP: (ppy)2Ir(acac) (4,4'-N,N'-dicarbazol-biphenyl: bis(2-phenylpyridine)acetoacetone iridium), CBP: Flrpic (4,4'-N,N'-dicarbazol-biphenyl: bis(4,6-difluorophenylpyridin-N,C2)picolinate iridium), and CBP: Btp2Ir(acac) (4,4'-N,N'-dicarbazol-biphenyl: bis(2-(2'-benzo[4,5-a]thienyl)pyridin-N,C30) iridium (aceacetone)); the electron transport layer 15 is Bphen (4,7-diphenyl-1,10-phenanthroline) with a thickness of 25 nm; the cathode layer 16 is a double-layered metal layer of samarium (Sm) and Al with a thickness of 200 nm; and preferably, the anode layer 12 is subject to a surface treatment process with $O_2$ plasma.

An IGZO film is used for the anode layer of the OLED device; compared with the OLED device in prior art that employs an ITO film for the anode layer, the work function of the IGZO film can be adjusted by adjusting the element contents in the IGZO film so as to expand the range within which the work function of the anode of the OLED device can be adjusted. After the surface treatment on the IGZO anode layer, the work function of the anode layer can be further decreased, thereby the light emitting efficiency of the OLED device can be improved.

As an example, the substrate 11 of the OLED device is made of quartz. The anode layer 12 is made of an IGZO film with a thickness of 50 nm; the hole transport layer 13 is formed from NPB with a thickness of 30-70 nm; The electron transport layer 15 and the light-emitting layer 14 are combined into one layer, made of 8-hydroxyquinoline aluminum (Alq) with a thickness of 30-70 nm: and the cathode layer 16 is an IGZO film with a thickness of 100 nm. Preferably, the IGZO cathode layer 16 is subject to surface treatment with $H_2$ plasma for a time period of, e.g., 1 minute. The IGZO anode layer is subject to surface treatment with $O_2$ plasma.

Both the cathode layer and the anode layer of the OLED device are IGZO films. Compared with the prior art, the work functions of the cathode and the anode of the OLED device has a wider range within which they can be adjusted. This improves the light emitting efficiency of the OLED device.

It should be noted that the functional layers of the various OLED devices as described above can further include structures such as a hole injection layer, a hole blocking layer, an electron injection layer, an electron blocking layer, a passivation layer and a protection layer, etc. Each layer may be made from organic small molecule materials, organic polymer materials, or inorganic materials, as well as composite doped materials, etc. The surface treatment on the IGZO film may include plasma treatment, such as treatment with the plasma of $H_2$, $CF_4$, etc., or liquid treatment, for example, with HCl, HF, etc. The IGZO film may also be a composite film comprising an IGZO film; for example, an Al/IGZO composite film is used for the cathode, and an Ag/IGZO composite film is used for the anode. Patterns can be etched onto the IGZO film to achieve improvement of optical properties.

Another embodiment of the invention provides an AMOLED display device.

The array substrate may comprise a plurality of gate lines, a plurality of data lines and a plurality of drive lines; the plurality of gate lines cross with the plurality of data lines so as to define a plurality of pixel units. The plurality of drive lines can be disposed parallel to the plurality of data lines, corresponding to different columns (parallel to the direction of data lines) of pixel units. Each pixel unit may comprise a switch transistor, a drive transistor and an organic light emitting diode as a light emitting device. The switch transistor is connected to a gate line and a data line to serve as the switch device of the pixel unit. The drive transistor is controlled by the switch transistor, and one of the source and drain electrodes is connected to a drive line, while the other is connected to the organic light emitting diode. The invention is not limited to the way of driving. Each pixel unit, depending on the different organic light emitting material employed for the organic light emitting diode, can emit, e.g., white light, red light, green light or blue light, etc. The following description is only directed to a single pixel unit while it is also applicable to other pixel units.

Figure 2:
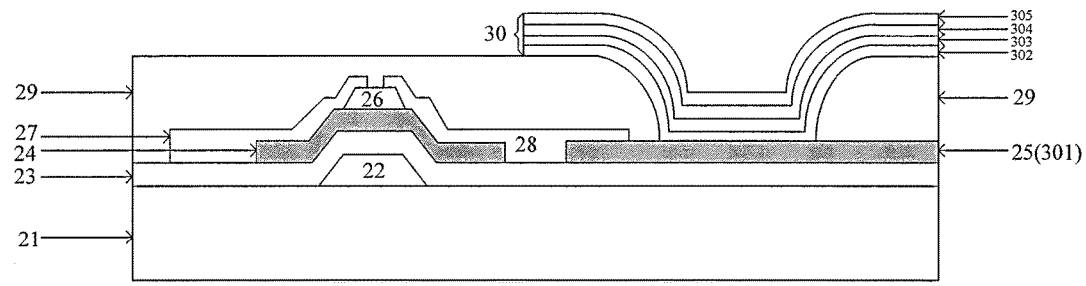
FIG. 2 is a structure diagram of an AMOLED display device provided in an embodiment of the invention.

As shown in FIG. 2, this AMOLED display device comprises a substrate 21, a gate electrode 22, a gate insulation layer 23, a TFT active layer 24 and a pixel electrode layer 25, an etching blocking layer 26, a source electrode 27, a drain electrode 28, a pixel defining layer 29, and an OLED device 30.

The TFT active layer 24 and the pixel electrode layer 25 are formed from the same layer of IGZO film by patterning through, e.g., photolithography and etching. The OLED device 30 comprises an anode layer 305 and a hole transport layer 304, a light emitting layer 303, and an electron transport layer 302. The electron transport layer 302, the light emitting layer 303 and the hole transport layer 304 are functional layers. The pixel electrode layer 25 is the anode layer 301 of the OLED device 30.

Figure 3:
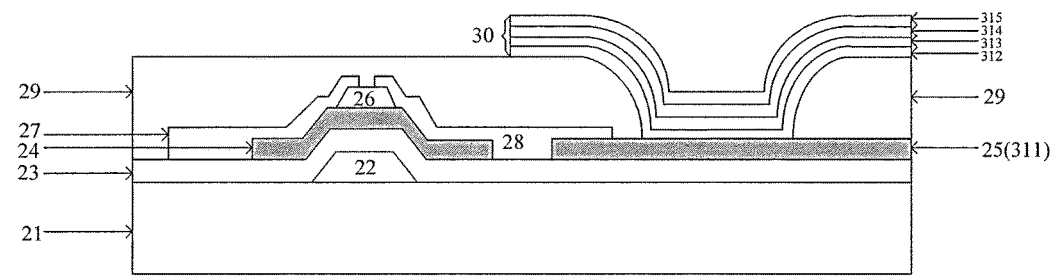
FIG. 3 is another structure diagram of an AMOLED display device provided in an embodiment of the invention.

Alternatively, as shown in FIG. 3, the OLED device 30 comprises a cathode layer 315, an electron transport layer 314, a light emitting layer 313, and a hole transport layer 312. The pixel electrode layer 25 is the anode layer 311 of the OLED device 30.

In the embodiments as shown in FIGS. 2 and 3, a reflective layer (not shown) can be further formed on the backside (that is, the side opposite to the OLED) of the substrate 21 to reflect the light emitted from the OLED device, so as to obtain a top emitting AMOLED display device. Alternatively, a reflective metal layer can be formed between the pixel electrode layer 25 and the substrate 21 to obtain the top emitting device.

In the AMOLED display device provided in the embodiment of the invention, the TFT active layer and the pixel electrode layer are formed from the same layer of IGZO film, and this pixel electrode layer serves as the cathode layer or anode layer of the OLED device. Compared with the prior art, the process of deposition, photolithography and etching of the pixel electrode layer in manufacturing the AMOLED display device are omitted, thereby reducing the production costs of the AMOLED display device. Moreover, the work function of the cathode layer or anode layer of the OLED device can be adjusted by adjusting the element contents of the IGZO film, increasing the range within which the work function of the cathode of the OLED device can be adjusted. The display efficiency of the AMOLED display device is improved.

The AMOLED display device provided in another embodiment of the invention can be based on the AMOLED display device as shown in FIG. 2, except that the anode layer 305 is formed with an IGZO material; and it may also be based on the AMOLED display device as shown in FIG. 3, except that the cathode layer 315 is formed with an IGZO material. In this way, both the cathode layer and the anode layer of the AMOLED display device are made of IGZO materials, and also the element contents of the IGZO materials of the cathode layer and the anode layer are adjusted to reduce the work function of the cathode layer and increase the work function of the anode layer so that the light emitting efficiency of the AMOLED display device can be increased.

Figure 4:
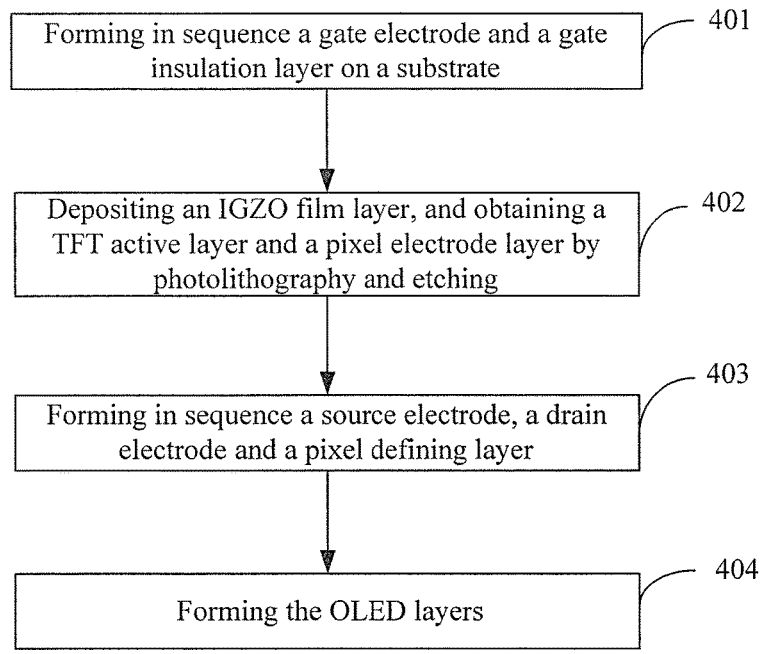
FIG. 4 is a flow chart of a method for manufacturing an AMOLED display device provided in an embodiment of the invention.

Below, the method for manufacturing an AMOLED provided in an embodiment of the invention is illustrated by reference to FIGS. 4 to 8. As shown in FIG. 4, this method comprises the following steps.

Step 401, forming in sequence a gate electrode and a gate insulation layer on a substrate.

Figure 5:
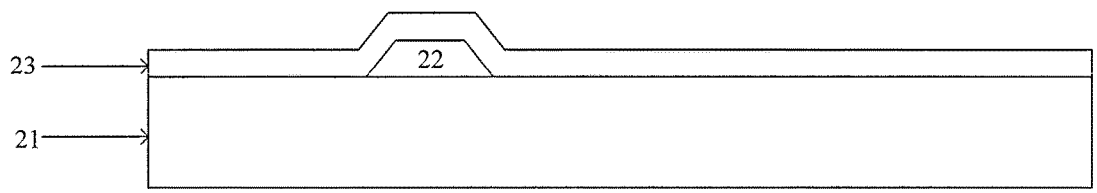
FIG. 5 is a first device structure diagram in the method for manufacturing an AMOLED display device provided in an embodiment of the invention.

As an example, this step comprises: cleaning the substrate 21; depositing the gate electrode metal layer by sputtering, evaporation, etc., and patterning this gate metal layer by photolithography and etching to obtain the gate electrode 22; and depositing the gate insulation layer 23 by a method such as chemical vapor deposition (CVD), plasma enhanced chemical vapor deposition, etc., as shown in FIG. 5. Of course, a passivation layer can be deposited after cleaning of the substrate so as to prevent damages on the structure on the substrate 21 caused by the impurities in the substrate 21.

Step 402, depositing an IGZO film layer, and patterning the IGZO film layer by photolithography and etching to obtain a TFT active layer and a pixel electrode layer.

Figure 6:
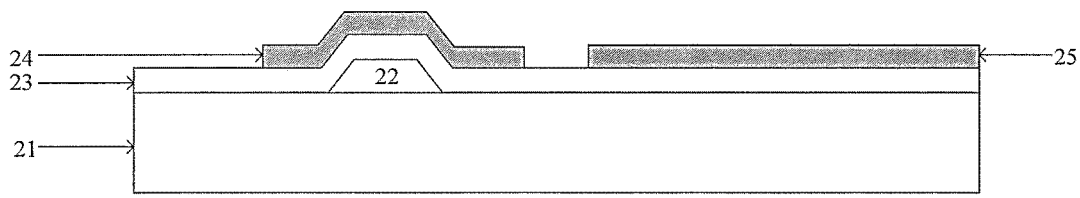
FIG. 6 is a second device structure diagram in the method for manufacturing an AMOLED display device provided in an embodiment of the invention.

As shown in FIG. 6, the IGZO film layer is deposited by a method such as sputtering, etc, and the IGZO film layer is patterned by photolithography and etching to obtain the TFT active layer 24 and the pixel electrode layer 25, which reduces the process of deposition, photolithography and etching of the pixel light emitting layer in prior art.

Preferably, the following steps may be conducted after Step 402.

An etching blocking layer is formed on the TFT active layer.

Figure 7:
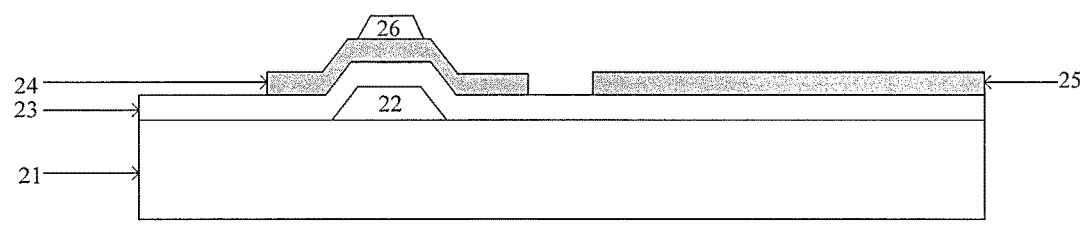
FIG. 7 is a third device structure diagram in the method for manufacturing an AMOLED display device provided in an embodiment of the invention.

The etching blocking material layer is obtained by a method such as sputtering, evaporation deposition, etc., and then the etching blocking layer 26 is formed by patterning via photolithography and etching, as shown in FIG. 7. The etching blocking layer 26 can avoid the damages of the IGZO source layer by the etching process for forming the source and drain electrodes.

Step 403, forming in sequence a source electrode, a drain electrode and a pixel defining layer.

Figure 8:
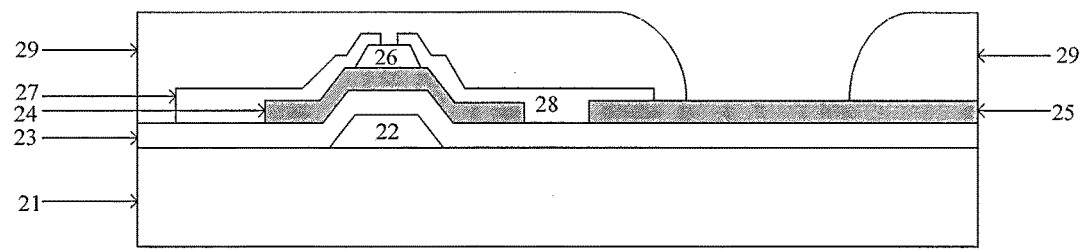
FIG. 8 is a fourth device structure diagram in the method for manufacturing an AMOLED display device provided in an embodiment of the invention.

The source-drain metal layer is deposited by a method such as sputtering, evaporation deposition, etc., and then the source electrode 26 and the drain electrode 28 are formed by patterning the source-drain metal layer via photolithography and etching. Then, an acrylic material or a resin material is spin-coated and deposited, followed by photolithography and curing to obtain the pixel defining layer 29. As shown in FIG. 8, an opening is formed in this pixel defining layer 29 to expose the pixel electrode layer 25. Of course, a step of forming a passivation layer can be included in this step, i.e., first the passivation layer is formed on the source electrode 27 and the drain electrode 28, and then the pixel defining layer is formed on the passivation layer; also an opening is formed in the passivation layer and the pixel defining layer to expose the pixel electrode layer 25.

So far, the back plate portion of the TFT array is formed.

Preferably, the following steps can be conducted after Step 403.

A surface treatment is conducted on the surface of the substrate with the formed pixel defining layer.

As an example, when the pixel electrode layer 25 in Step 402 serves as the cathode 401 of the OLED device in Step 406, it can be subject to surface treatment with $H_2$. $CF_4$ plasma, or it can be subjected to surface treatment with liquid such as HCl, HF, etc. When the pixel electrode layer 25 in Step 402 serves as the anode 311 of the OLED device in Step 406, it can be subject to surface treatment with $O_2$ plasma. By conducting this step, the surface work function of the IGZO film can be further decreased or increased.

Step 404, forming the OLED device.

As an example, when the pixel light emitting region 25 in Step 402 serves as the cathode 301 of the OLED device in Step 404, an electron transport layer 302, an organic light emitting layer 303, a hole transport layer 304 and an anode layer 305 are deposited in sequence by heat evaporation under vacuum conditions, and therefore the AMOLED display device as shown in FIG. 2 is obtained. When the pixel electrode layer 25 in Step 402 serves as the anode 311 of the OLED device in Step 404, a hole transport layer 312, an organic light emitting layer 313, an electron transport layer 314 and a cathode layer 315 are deposited in sequence, and therefore the AMOLED display device as shown in FIG. 3 is obtained. Of course, an electrode modification layer, a hole injection layer, an electron injection layer, an optical transmission enhanced layer, etc., can be further added in this step.

In the method for manufacturing the AMOLED display device provided in an embodiment of the invention, the TFT active layer and the pixel electrode layer are formed from the same IGZO film by a same deposition, photolithography and etching process. This pixel electrode layer serves as the cathode layer or the anode layer of the OLED device. Compared with the prior art, the process for preparing the pixel electrode layer during manufacturing the AMOLED display device is omitted, thereby reducing the production costs of the AMOLED display device. Moreover, by adjusting the element contents of the IGZO film, its work function as an OLED electrode can be adjusted, so as to improve the light emitting efficiency of the OLED device.

Below, the method for manufacturing the AMOLED display device provided in the invention is specifically illustrated by way of specific embodiments.

As a first embodiment of the method for manufacturing the AMOLED display device, this process comprises the following steps.

Step 501, the substrate 21 is cleaned. A SiO2 film with a thickness of 200 nm is deposited using a CVD method as a buffer layer. Metal Mo is deposited by a sputtering method with a thickness of 200 nm. The Mo layer is patterned by using photolithography and etching to obtain the gate electrode 22. SiO2 is deposited at 370 degrees Celsius using a CVD method with a thickness of 150 nm as the gate insulation layer 23.

Steps 502, an IGZO film layer with a thickness of 50 nm is deposited using a sputtering method. This IGZO film layer is patterned using photolithography and etching to obtain the source layer 24 and the pixel electrode layer 25.

Step 503, a SiO2 layer with a thickness of 50 nm is deposited using a sputtering method. This SiO2 layer is patterned using photolithography and etching to obtain the blocking layer 26.

Step 504, a metal layer with a thickness of 200 nm is deposited using a sputtering method. This metal layer is a double-layered metal layer consisting of Mo and Al. This double-layered metal layer is patterned using photolithography and etching to obtain the source electrode 27 and the drain electrode 28. An acrylic material is spin-coated and deposited followed by photolithography and curing to obtain the pixel defining layer 29 with a thickness of 1.5 nm.

So far, the back plate portion of the TFT array is formed.

Step 505, the surface of the TFT substrate is treated with $H_2$ plasma, and in the meantime the surface layer is subject to passivation.

Step 506, the electron transport layer 302 and the light emitting layer 303 are deposited in sequence by heat evaporation under vacuum of $1 \times 10^{-5}$ Pa at 190 degrees Celsius, the hole transport layer 304 is deposited by heat evaporation under vacuum of $1 \times 10^{-5}$ Pa at 170 degrees Celsius, and the anode layer 305 is deposited by heat evaporation under vacuum of $1 \times 10^{-5}$ Pa at 900 degrees Celsius.

The electron transport layer 302 and the light emitting layer 303 are combined into one layer, which is formed from 8-hydroxyquinoline aluminum (ALQ) with a thickness of 30~70 nm. The hole transport layer 304 is formed from NPB with a thickness of 30~70 nm. The anode layer 305 has an Au—Al double-layered structure. The evaporation rate of the Au layer is 1 nm/min, and its thickness is 5~10 nm. The Al layer has a thickness of 100-300 nm.

The AMOLED display device manufactured with the aforementioned method emits green light (with peak of emission being 522 nm). The mode of emission is bottom emission.

As a second embodiment of the method for manufacturing the AMOLED display device, this process comprises the following steps.

Step 601, the substrate 21 is cleaned. A SiO2 film with a thickness of 200 nm is deposited using a CVD method as the passivation layer. A metal Cr film layer with a thickness of 200 nm is deposited by a sputtering method. The metal Cr film layer is patterned by using photolithography and etching to obtain the gate electrode 22. SiO2 and SiNx are deposited at 390 degree Celsius using a CVD method as the gate insulation layer 23 with a thickness of 120 nm.

Steps 602, an IGZO film layer with a thickness of 50 nm is deposited using a sputtering method and is subjected to annealing for 1 h at 400 degrees Celsius under a pure oxygen atmosphere. This IGZO film layer is patterned using photolithography and etching to obtain the source layer 24 and the pixel electrode layer 25.

Step 603, a SiO2 layer with a thickness of 50 nm is deposited using a sputtering method. This SiO2 layer is patterned using photolithography and etching to obtain the blocking layer 26.

Step 604, a metal layer with a thickness of 200 nm is deposited using a sputtering method. This metal layer is a double-layered metal layer consisting of Mo and Ti. This double-layered metal layer is patterned using photolithography and etching to obtain the source electrode 27 and the drain electrode 28. An organic resin material is spin-coated and deposited followed by photolithography and curing to obtain the pixel defining layer 29 with a thickness of 2 μm.

So far, the back plate portion of the TFT array is formed.

Step 605, the surface of the TFT substrate is treated with $O_2$ plasma.

Step 606, V2O5 is deposited as the hole enhancing layer with a thickness of 5~10 nm. NPB is deposited as the hole transport layer 312 with a thickness of 50 nm. The light emitting layer 313 is manufactured using an evaporation deposition process with a separate pixel region mask. The following primary materials doped with phosphorescent materials, which have a thickness of 25 nm, are used for the green light, blue light and red light pixel regions: CBP: (ppy)2Ir(acac), CBP: FIrpic and CBP: Btp2Ir(acac). Bphen is deposited as the electron transport layer 314 with a thickness of 25 nm. An Sm and Al layer with a thickness of 200 nm is deposited as the cathode layer 315.

The AMOLED display device manufactured with the aforementioned method emits full color light. The mode of emission is bottom emission.

As a third embodiment of the method for manufacturing the AMOLED display device, this process comprises the following steps.

Step 701, the substrate 21 is cleaned. An Al layer with a thickness of 150~300 nm is evaporation deposited on the back side of the substrate 21 as a reflective mirror. A metal Mo film layer with a thickness of 200 nm is deposited by a sputtering method. The metal Mo film layer is patterned by using photolithography and etching to obtain the gate electrode 22. SiO2 and SiNx are deposited at 390 degrees Celsius using a CVD method as the gate insulation layer 23 with a thickness of 120 nm.

Steps 702, an IGZO film layer with a thickness of 50 nm is deposited using a sputtering method. This IGZO film layer is patterned using photolithography and etching to obtain the source layer 24 and the pixel electrode layer 25.

Step 703, a SiO2 layer with a thickness of 50 nm is deposited using a sputtering method. This SiO2 layer is patterned using photolithography and etching to obtain the blocking layer 26.

Step 704, a metal layer with a thickness of 200 nm is deposited using a sputtering method. This metal layer is a double-layered metal layer consisting of Mo and Ti. This double-layered metal layer is patterned using photolithography and etching to obtain the source electrode 27 and the drain electrode 28. A composite layer of SiO2 and SiNx is deposited, and this composite layer is patterned by photolithography and etching to obtain a passivation layer. An organic resin material is spin-coated and deposited followed by photolithography and curing to obtain the pixel defining layer 29 with a thickness of 2 μm.

So far, the back plate portion of the TFT array is formed.

Step 705, the surface of the TFT substrate is treated with $CF_4$ plasma, and in the meantime the surface layer is subject to passivation.

Step 706, the organic electron transport layer 302, light emitting layer 303 and the hole transport layer 304 are combined into one layer using spin-coating and deposition of MEH-PPV with a thickness of 80 nm. A composite layer of $V_2O_5$ and Au is deposited as the anode layer 305. The $V_2O_5$ layer has a thickness of 5~10 nm. The evaporation rate of Au is 1 nm/min, and its thickness is 15~30 nm.

The AMOLED display device manufactured with the aforementioned method emits red light. The mode of emission is top emission.

The above are just exemplary embodiments of the invention, rather than limiting the scope of the invention which is determined by the appended claims.

The invention claimed is:

1. An active matrix organic light emitting diode display device comprising a thin film transistor (TFT), a pixel electrode layer and an OLED device,
wherein the TFT comprises a gate electrode, a gate insulation layer, a TFT active layer, an etching blocking layer on the TFT active layer, and a drain electrode and a source electrode, the drain electrode and the source electrode are separated by the etching blocking layer and each comprise a part on the etching blocking layer, and the drain electrode and the source electrode are in direct physical contact with the etching blocking layer, the OLED device comprises a cathode layer and a functional layer, the pixel electrode layer serving as the anode layer of the OLED device; alternatively, the OLED device comprises an anode layer and a functional layer, the pixel electrode layer serving as the cathode layer of the OLED device; and
the TFT active layer and the pixel electrode layer are formed on the gate insulation layer from a same IGZO film by a patterning process, the TFT active layer and the pixel electrode layer are isolated from each other, the drain electrode fills a gap between the TFT active layer and the pixel electrode layer, and the pixel electrode layer is electrically connected with the drain electrode, the drain electrode having another part on the pixel electrode layer;
the TFT active layer, the cathode layer, and the anode layer are all made of an IGZO material;
a work function of the IGZO film can be decreased by modifying the concentration of indium, gallium, zinc and oxide within the IGZO film.

2. A method for manufacturing an active matrix organic light emitting diode (AMOLED) display device comprising:
forming in sequence a gate electrode and a gate insulation layer on a substrate;
depositing an IGZO film layer and patterning the IGZO film layer to obtain a TFT active layer and a pixel electrode layer that are on a same layer, the TFT active layer and the pixel electrode layer are isolated from each other, the drain electrode fills a gap between the TFT active layer and the pixel electrode layer;
forming an etching blocking layer on the TFT active layer;
forming in sequence a source electrode, a drain electrode, and a pixel defining layer, the pixel defining layer having an opening that exposes the pixel electrode layer, and conducting surface treatment on a surface of the pixel electrode layer, which is exposed through the opening, with plasma or liquid to adjust element contents in the IGZO film forming the pixel electrode layer, wherein the drain electrode and the source electrode are separated by the etching blocking layer and each have a part on the etching blocking layer, and the drain electrode and the source electrode are in direct physical contact with the etching blocking layer, and the pixel electrode layer is electrically connected with the drain electrode, the drain electrode having another part on the pixel electrode layer; and
forming an OLED device, wherein the pixel electrode layer serves as an anode or a cathode of the OLED device;
the TFT active layer, the cathode layer, and the anode layer are all prepared from an IGZO material;
the cathode layer is subject to surface treatment with $H_2$ plasma or $CF_4$ plasma, or liquid treatment such as HCl, HF; the anode layer is subject to surface treatment with $O_2$ plasma;
after the surface treatment on the IGZO cathode layer a work function of the IGZO film can be decreased by modifying the concentration of indium, gallium, zinc and oxide within the IGZO film.

3. The method according to claim 2, where the forming the OLED device comprises:
depositing a functional layer and the anode in sequence or a functional layer and the cathode in sequence on the pixel electrode layer.

4. The AMOLED display device according to claim 1, further comprising an etching blocking layer, which is disposed on the TFT active layer.

5. The method according to claim 3, further comprising, after depositing the IGZO film and patterning the IGZO film layer to obtain the TFT active layer and the pixel electrode layer,
forming an etching blocking layer on the TFT active layer.

* * * * *